US012784816B2

(12) United States Patent
Choi

(10) Patent No.: US 12,784,816 B2
(45) Date of Patent: Nov. 3, 2026

(54) MEMORY DEVICE FOR PERFORMING READ OPERATION AND PROGRAM VERIFICATION OPERATION

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 151 days.

(21) Appl. No.: 19/010,187

(22) Filed: Jan. 6, 2025

(65) Prior Publication Data

US 2025/0140308 A1 May 1, 2025

Related U.S. Application Data

(62) Division of application No. 18/170,548, filed on Feb. 17, 2023, now Pat. No. 12,237,006.

(30) Foreign Application Priority Data

Oct. 27, 2022 (KR) ........................ 10-2022-0140158

(51) Int. Cl.
*G11C 11/4096* (2006.01)
*G11C 11/408* (2006.01)
*G11C 11/4094* (2006.01)

(52) U.S. Cl.
CPC ...... *G11C 11/4096* (2013.01); *G11C 11/4085* (2013.01); *G11C 11/4094* (2013.01)

(58) Field of Classification Search
CPC ............ G11C 11/4096; G11C 11/4085; G11C 11/4094
See application file for complete search history.

(56) References Cited

U.S. PATENT DOCUMENTS

2025/0226039 A1* 7/2025 Lien ........................ G11C 16/24

* cited by examiner

*Primary Examiner* — Han Yang
(74) *Attorney, Agent, or Firm* — IP&T GROUP LLP

(57) ABSTRACT

A memory device includes a memory cell array including memory cells; a row control circuit coupled to the memory cells through word lines and configured to apply, to a selected word line during read operations, respective read voltages having different levels; a page buffer circuit coupled to the memory cells through bit lines and configured to adjust, according to a sensing control signal during each of the read operations, an amount of current flowing through the bit lines to sense the adjusted amount; and a read control circuit configured to adjust, during a second read operation subsequent to a first read operation among the read operations, a voltage level of the sensing control signal when a voltage level of a second read voltage corresponding to the second read operation is different from a level of a first read voltage corresponding to the first read operation.

6 Claims, 12 Drawing Sheets

MEMORY DEVICE FOR PERFORMING READ OPERATION AND PROGRAM VERIFICATION OPERATION

CROSS-REFERENCE TO RELATED APPLICATION

The present application is a division of U.S. patent application Ser. No. 18/170,548 filed on Feb. 17, 2023, which claims the benefit of Korean Patent Application No. 10-2022-0140158, filed on Oct. 27, 2022, which is incorporated herein by reference in its entirety.

BACKGROUND

1. Field

Various embodiments of the present invention relate to a read operation of a nonvolatile memory device.

2. Description of the Related Art

Memory devices may be classified into volatile devices and nonvolatile memory devices.

Non-volatile memory devices perform a read/write operation at a relatively lower speed than volatile memory devices but retain stored data even when a power supply is cut off. Accordingly, non-volatile memory devices are frequently used in portable electronic devices for storing data which need to be retained regardless of whether or not power is supplied to the devices.

Examples of non-volatile memory devices include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like.

The flash memory may store one bit data in one memory cell or may store two or more bits of data. Generally, a memory cell storing one bit data is referred to as a single level cell, and a memory cell storing two or more bits of data is referred to as a multi-level cell. The single level cell has an erase state and a program state according to a threshold voltage. The multi-level cell has an erase state and a plurality of program states according to a threshold voltage.

Recently, various methods have been attempted to reduce current consumption during a plurality of read operations to determine the program states of the multi-level cell of the flash memory.

SUMMARY

Embodiments of the present invention are directed to provide a memory device capable of selectively adjusting voltage levels of bit lines at a time when a read voltage applied to a selected word line changes during a read operation or a program verification operation.

According to an embodiment of the present invention, a memory device includes a memory cell array including a plurality of memory cells; a row control circuit coupled to the memory cells through a plurality of word lines and configured to apply, to a selected word line during read operations, respective read voltages having different levels; a page buffer circuit coupled to the memory cells through a plurality of bit lines and configured to adjust, according to a sensing control signal during each of the read operations, an amount of current flowing through the bit lines to sense the adjusted amount; and a read control circuit configured to adjust, during a second read operation subsequent to a first read operation among the read operations, a voltage level of the sensing control signal when a voltage level of a second read voltage corresponding to the second read operation is different from a level of a first read voltage corresponding to the first read operation.

According to an embodiment of the present invention, a memory device includes a memory cell array including a plurality of memory cells programmed into a plurality of program states; a peripheral circuit coupled to the memory cell array through a plurality of word lines and a plurality of bit lines, and configured to perform a plurality of read operations on selected memory cells among the memory cells; and a control logic configured to control the peripheral circuit to adjust, during a current read operation of the read operations, a voltage level of the bit lines when a level of a read voltage applied to a selected word line during the current read operation is different from a level of a read voltage during a previous read operation.

According to an embodiment of the present invention, an operating method of a memory device includes performing a first read operation including: applying a first read voltage to a word line selected from a plurality of word lines; and sensing an amount of current flowing through a plurality of bit lines according to a sensing control signal; and performing a second read operation including: applying a second read voltage to the selected word line; adjusting a voltage level of the sensing control signal when a level of the second read voltage is different from a level of the first read voltage; and sensing the amount of current flowing through the bit lines according to the sensing control signal.

According to an embodiment of the present invention, a memory device includes a memory cell array including a plurality of memory cells; a peripheral circuit coupled to the memory cell array through a plurality of word lines and a plurality of bit lines, and configured to perform a plurality of program loops on selected memory cells among the memory cells, each program loop including a program voltage application operation and a program verification operation; and a control logic configured to control the peripheral circuit to adjust, during a current program verification operation, a voltage level of the bit lines when a level of a verification voltage applied to a selected word line during the current program verification operation is different from a level of a verification voltage applied during a previous program verification.

According to an embodiment of the present invention, an operating method of a memory device includes performing a first verification operation including: applying a first verification voltage to a word line selected from a plurality of word lines; and sensing an amount of current flowing through a plurality of bit lines according to a sensing control signal; and performing a second verification operation including: applying a second verification voltage to the selected word line; adjusting a voltage level of the sensing control signal when a level of the second verification voltage is different from a level of the first verification voltage; and sensing the amount of current flowing through the bit lines according to the sensing control signal.

According to an embodiment of the present invention, an operating method of a memory device includes applying, during a current read operation, a current read voltage to a selected row within a memory cell array; and sensing, during the current read operation, an amount of current flowing through columns within the array by decreasing the amount when the current read voltage is greater than a previous read voltage and by increasing the amount when the current read voltage is less than the previous read voltage, wherein the previous read voltage corresponds to a previous read operation on the selected row, and wherein the previous and current read operations are consecutive read operations among plural read operations.

DETAILED DESCRIPTION

Figure 1:
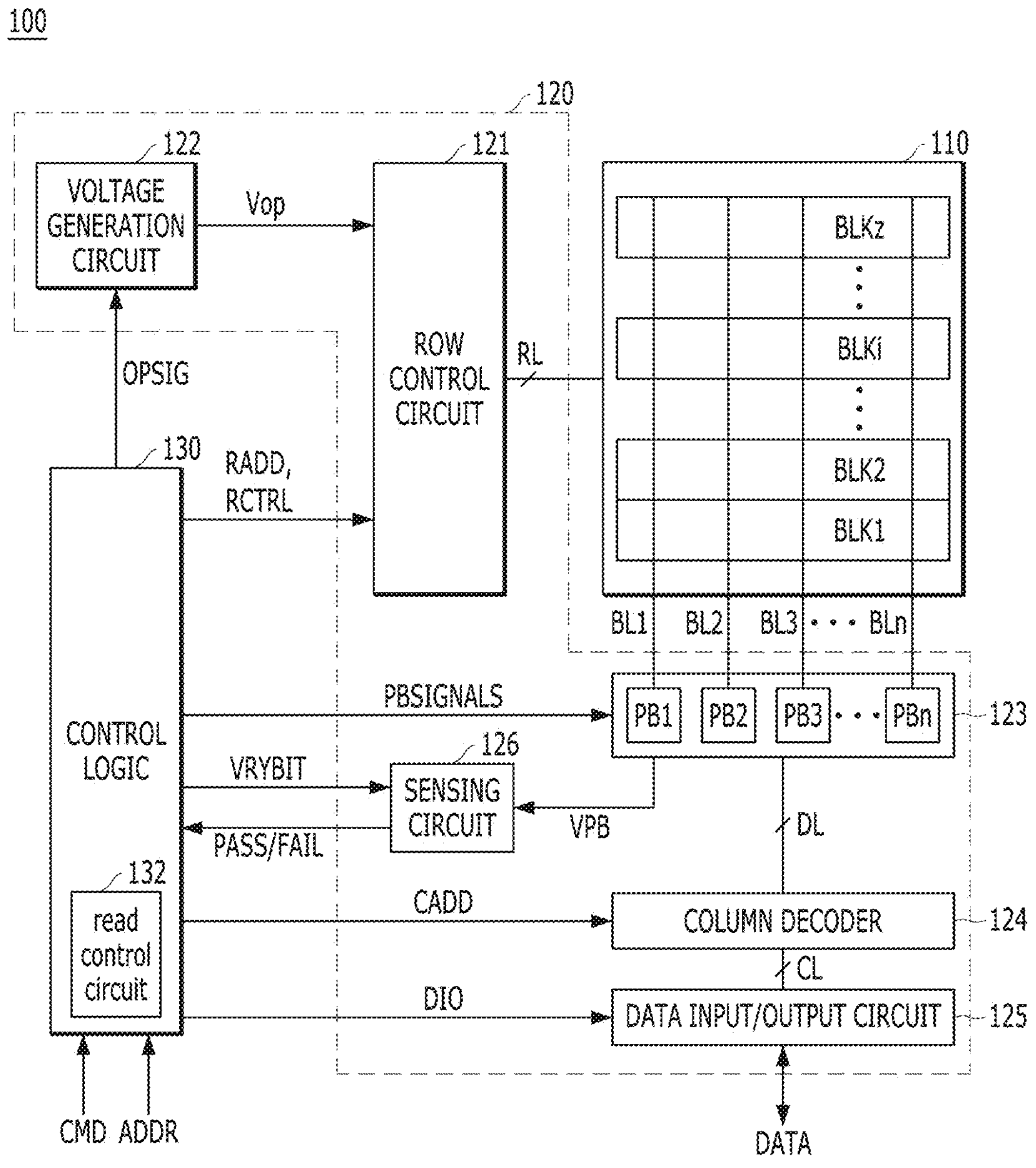
FIG. 1 is a block diagram illustrating a memory device in accordance with an embodiment of the present invention.

Specific structural and functional descriptions provided herein are directed to embodiments of the present invention. The present invention, however, is not limited to the embodiments described herein.

While embodiments are described in detail, the present invention is not limited to any specific detail. The present invention may be embodied in many different forms and should not be construed as being limited to any specific description. Rather, the present invention should be construed to cover not only the disclosed embodiments, but also various alternatives, modifications, equivalents, and other embodiments that fall within the spirit and scope of the present invention.

It will be understood that, although the terms "first", "second", etc. may be used herein to identify various elements, these elements should not be limited by these terms. These terms are only used to distinguish one element from another element that otherwise have the same or similar names. A first element in one instance could be termed a second element in another instance without departing from the teachings of the present invention.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present invention, the singular forms are intended to include the plural forms as well, unless the context clearly indicates otherwise. It will be further understood that open ended terms, such as "comprise", "include", "have", etc., when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art may be omitted to avoid obscuring the subject matter of the present invention. This aims to omit unnecessary description to make the subject matter of the present invention clear.

Various embodiments of the present invention are described more fully below with reference to the accompanying drawings, in which preferred embodiments of the present invention are shown, so that those skilled in the art can easily carry out and practice the present invention.

FIG. 1 is a block diagram illustrating a memory device 100 in accordance with an embodiment of the present invention.

Referring to FIG. 1, the memory device 100 may include a memory cell array 110, a peripheral circuit 120, and a control logic 130.

The memory cell array 110 may include a plurality of memory blocks BLK1 to BLKz. Each of the memory blocks BLK1 to BLKz may have a three-dimensional (3D) structure. Each of the memory blocks BLK1 to BLKz may include a plurality of memory cells that are stacked on a substrate. The memory blocks BLK1 to BLKz may be connected to the peripheral circuit 120 through a plurality of row lines RL and may be coupled to the peripheral circuit 120 through a plurality of bit lines BL1 to BLn. The memory blocks BLK1 to BLKz may be coupled in common to first to n-th bit lines BL1 to BLn.

In an embodiment, the plurality of memory cells may be nonvolatile memory cells. The row lines RL may include at least one source selection lines, a plurality of word lines, and at least one drain selection line. Memory cells that are coupled to the same word line may be defined as one page. Hence, each memory block may include a plurality of pages.

Each of the memory cells in the memory cell array 110 may be formed as a single level cell (SLC) that is capable of storing data of a single bit, a multi-level cell (MLC) that is capable of storing data of two bits, a triple-level cell (TLC) that is capable of storing data of three bits, or a quad-level cell (QLC) that is capable of storing data of four bits. In particular, in an embodiment of the present invention, the memory cells may be composed of cells that store data of two bits or more.

The peripheral circuit 120 may perform a program operation, a read operation, or an erase operation on a selected area of the memory cell array 110 under the control of the control logic 130. The peripheral circuit 120 may drive the memory cell array 110. For example, under the control of the control logic 130, the peripheral circuit 120 may supply various operating voltages to the row lines RL and the first to n-th bit lines BL1 to BLn or discharge the applied voltages. The program operation may include one or more program loops. Each of the program loops may include a program voltage application operation for applying a program voltage and a program verification operation for verifying a program result by using a verification voltage. The peripheral circuit 120 may perform one or more program loops including the program voltage application operation and the program verification operation on memory cells that are coupled to a selected one of the row lines RL.

In detail, the peripheral circuit 120 may include a row control circuit 121, a voltage generation circuit 122, a page buffer circuit 123, a column decoder 124, a data input/output circuit 125, and a sensing circuit 126.

The row control circuit 121 may be coupled to the cell array 110 through the row lines RL. The row control circuit 121 may operate under the control of the control logic 130. The row control circuit 121 may receive a row address RADD and a row control signal RCTRL from the control logic 130. In an embodiment, the row control circuit 121 may decode the row address RADD to select at least one among the memory blocks BLK1 to BLKz. In an embodiment, the row control circuit 121 may decode the row address RADD to select a row line RL of the selected memory block and may selectively apply operating voltages Vop that are generated by the voltage generation circuit 122 to the selected row line RL according to the row control signal RCTRL.

For example, during the program voltage application operation, the row control circuit 121 may apply a program voltage to a selected word line and may apply a program pass voltage having a level that is lower than that of the program voltage to unselected word lines. During the program verification operation, the row control circuit 121 may apply a verification voltage to a selected word line and apply a verification pass voltage having a level that is higher than that of the verification voltage to unselected word lines. During the read operation, the row control circuit 121 may apply a read voltage to a selected word line and apply a read pass voltage having a level that is higher than that of the read voltage to unselected word lines. During the erase operation, the row control circuit 121 may decode the row address RADD to select a memory block. During the erase operation, the row control circuit 121 may apply a ground voltage to word lines that are coupled to the selected memory block.

In particular, when the memory cells are composed of cells storing data of two bits or more, the memory cells may be programmed into a plurality of program states. Accordingly, the row control circuit 121 may repeat a plurality of read operations (or program verification operations) that apply different levels of read voltages (or verification voltages) to the selected word line as many times as to determine program states. In an embodiment, the row control circuit 121 may include components, such as an address buffer, a decoder, and the like. The voltage generation circuit 122 may operate under the control of the control logic 130. The voltage generation circuit 122 may generate the operating voltages Vop by using an external supply voltage that is supplied to the memory device 100. In detail, the voltage generation circuit 122 may generate the operating voltages Vop that are used for the program operation, the read operation, and the erase operation, according to an operation signal OPSIG provided from the control logic 130. For example, the voltage generation circuit 122 may generate the program voltage, the verification voltage, the pass voltage, the verification pass voltage, the read voltage, and an erase voltage.

Depending on an embodiment, the voltage generation circuit 122 may generate an internal supply voltage by regulating the external supply voltage. The internal supply voltage that is generated by the voltage generation circuit 122 may be used as an operating voltage for the memory device 100. Depending on an embodiment, the voltage generation circuit 122 may generate the operating voltages Vop by using the external supply voltage or the internal supply voltage. For example, the voltage generation circuit 122 may include a plurality of pumping capacitors for receiving the internal supply voltage and may generate the operating voltages Vop by selectively enabling the plurality of pumping capacitors under the control of the control logic 130. The generated operating voltages Vop may be supplied to the memory cell array 110 by the row control circuit 121.

The page buffer circuit 123 may operate as a "read circuit" during a read operation of the memory cell array 110 and as a "write circuit" during a write operation. The page buffer circuit 123 may include first to n-th page buffers PB1 to PBn. The first to n-th page buffers PB1 to PBn may be coupled to memory cells of the memory cell array 110 through the first to n-th bit lines BL1 to BLn, respectively. The first to n-th page buffers PB1 to PBn may operate under the control of the control logic 130. For example, the first to n-th page buffers PB1 to PBn may operate in response to page buffer control signals PBSIGNALS provided from the control logic 130. The first to n-th page buffers PB1 to PBn may temporarily store data that is transferred through the first to n-th bit lines BL1 to BLn, and sense voltage, or current of the first to n-th bit lines BL1 to BLn.

In an embodiment, during the program voltage application operation when the program voltage is applied to the selected word line, the first to n-th page buffers PB1 to PBn may receive data DATA from the data input/output circuit 125 through data lines DL. The data that is received to the first to n-th page buffers PB1 to PBn may be stored in the memory cells of the selected word line through the first to n-th bit lines BL1 to BLn. Threshold voltages of memory cells that are coupled to a bit line to which a program permission voltage (e.g., a ground voltage) is applied may be increased, and threshold voltages of memory cells that are coupled to a bit line to which a program inhibit voltage (e.g., a power supply voltage) is applied may be maintained. In an embodiment, during the program verification operation, the first to n-th page buffers PB1 to PBn may read out data from selected memory cells through the first to n-th bit lines BL1 to BLn.

In an embodiment, in order to sense threshold voltages of memory cells of a selected page during the read operation or the program verification operation, the first to n-th page buffers PB1 to PBn may continuously supply sensing current to bit lines connected to the memory cells while sensing changes in the amount of current flowing through a sensing node depending on program states of the corresponding memory cells. During the read operation, the first to nth page buffers PB1 to PBn may output the sensed data DATA to the data input/output circuit 125 under the control of the column decoder 124.

During the erase operation, the first to n-th page buffers PB1 to PBn may float the first to n-th bit lines BL1 to BLn.

The column decoder 124 may operate under the control of the control logic 130. The column decoder 124 may transfer data between the data input/output circuit 125 and the page buffer circuit 123 in response to a column address CADD provided from the control logic 130. For example, the column decoder 124 may exchange data with the first to n-th page buffers PB1 to PBn through the data lines DL or may exchange data with the data input/output circuit 125 through data lines CL.

The data input/output circuit 125 may receive or transmit data DATA from or to an external device, i.e., a memory controller. The data input/output circuit 125 may operate under the control of the control logic 130. Depending on an embodiment, the data input/output circuit 125 may include a plurality of input/output buffers (not shown) for receiving/outputting the data in response to input/output control signals DIO provided from the control logic 130. During the program operation, the data input/output circuit 125 may receive the data to be stored from the memory controller. During the read operation, the data input/output circuit 125 may output, to the memory controller, the data from the first to n-th page buffers PB1 to PBn.

The sensing circuit 126 may generate a reference current in response to an enable bit signal VRYBIT generated by the control logic 130 and may output a pass or fail signal PASS/FAIL to the control logic 130 by comparing a sensing voltage VPB that is received from the page buffer circuit 123 with a reference voltage that is generated by the reference current.

The control logic 130 may be coupled to the row control circuit 121, the voltage generation circuit 122, the page buffer circuit 123, the column decoder 124, the data input/output circuit 125, and the sensing circuit 126. The control logic 130 may control the overall operation of the memory device 100. The control logic 130 may be operated in response to a command CMD and an address ADDR that are transmitted from the memory controller. The control logic 130 may control the peripheral circuit 120 by generating various types of signals in response to the command CMD and the address ADDR. For example, the control logic 130 may generate the operation signal OPSIG, the row address RADD, the row control signal RCTRL, the page buffer control signals PBSIGNALS, the column address CADD, the input/output control signals DIO, and the enable bit signal VRYBIT in response to the command CMD and the address ADDR. The control logic 130 may output the operation signal OPSIG to the voltage generation circuit 122, output the row address RADD and the row control signal RCTRL to the row control circuit 121, output the page buffer control signals PBSIGNALS to the page buffer circuit 123, output the column address CADD to the column decoder 124, output the input/output control signals DIO to the data input/output circuit 125, and output the enable bit signal VRYBIT to the sensing circuit 126. In addition, the control logic 130 may determine whether the program verification operation is pass or fail in response to the pass or fail signal PASS/FAIL that is output from the sensing circuit 126.

In an embodiment, the control logic 130 may include a read control circuit 132. The read control circuit 132 may provide the page buffer control signals PBSIGNALS to the page buffer circuit 123 so as to adjust the amount of current flowing through the bit lines BL1 to BLn by adjusting a voltage level of the bit lines BL1 to BLn when a read voltage applied to a selected word line during a current read operation is different from a read voltage applied during a previous read operation. In addition, the read control circuit 132 may provide the page buffer control signals PBSIGNALS to the page buffer circuit 123 so as to adjust the amount of current flowing through the bit lines BL1 to BLn by adjusting the voltage level of the bit lines BL1 to BLn when a verification voltage applied to a selected word line during a current program verification operation is different from a verification voltage applied during a previous program verification operation.

Figure 2:
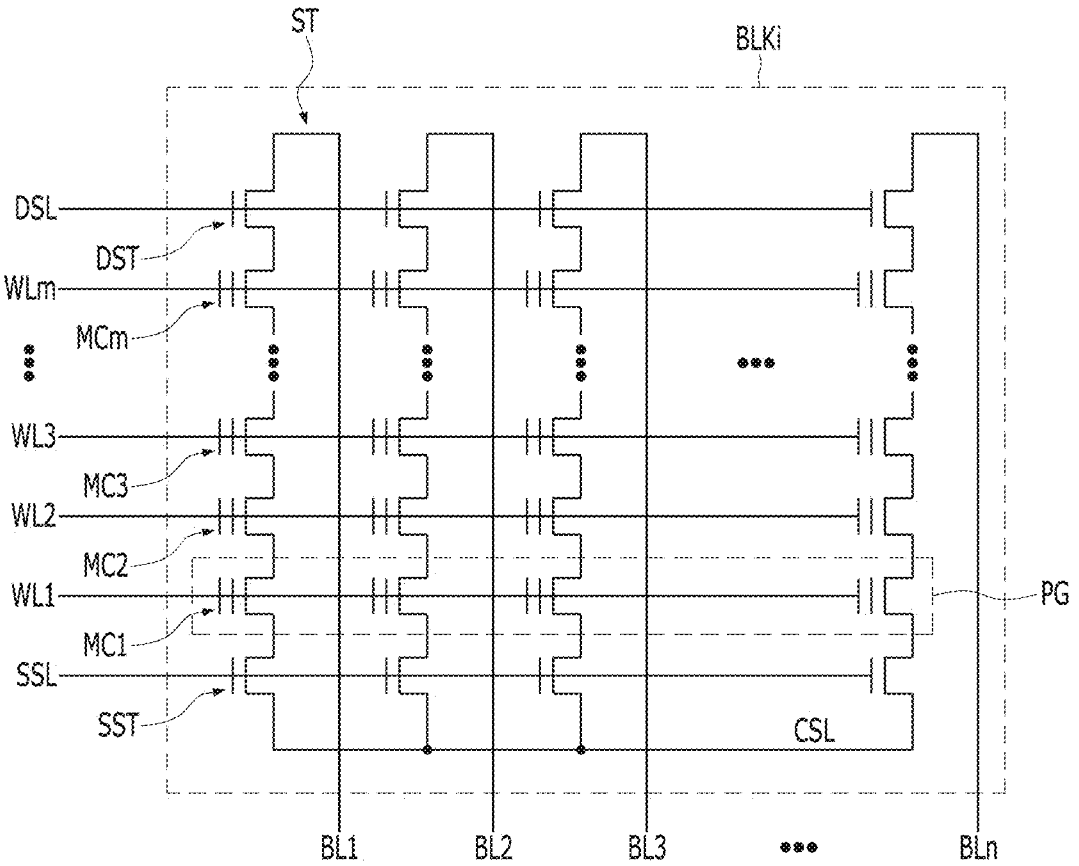
FIG. 2 is a diagram illustrating a detailed structure of a representative memory block of a plurality of memory blocks of FIG. 1 in accordance with an embodiment of the present invention.

FIG. 2 is a diagram illustrating a detailed structure of a representative memory block BLKi of the plurality of memory blocks BLK1 to BLKz of FIG. 1 in accordance with an embodiment of the present invention.

Referring to FIG. 2, the memory block BLKi may be connected to a plurality of word lines WL1 to WLm arranged parallel to each other between a first selection line SSL and a second selection line DSL. Here, the first selection line SSL may be a source selection line SSL, and the second selection line DSL may be a drain selection line DSL. The memory block BLKi may include a plurality of cell strings ST that are coupled between a plurality of bit lines BL1 to BLn and a source line CSL. The bit lines BL1 to BLn may be respectively coupled to the cell strings ST, and the source line CSL may be coupled in common to the cell strings ST. Since the cell strings ST may be configured to be the same, the cell string ST connected to the first bit line BL1 will be described in detail as an example.

The cell string ST may include a source selection transistor SST, a plurality of memory cells MC1 to MCm, and a drain selection transistor DST, which are coupled between the source line CSL and the corresponding first bit line BL1 in series. Although, in FIG. 2, one source selection transistor SST and one drain selection transistor DST are illustrated as being included in one cell string ST, a plurality of source selection transistors SST and a plurality of drain selection transistors DST may be included in one cell string ST depending on the memory device.

A source of the source selection transistor SST may be connected to the source line CSL, and a drain of the drain selection transistor DST may be connected to the first bit line BL1. The memory cells MC1 to MCm may be connected in series between the source selection transistor SST and the drain selection transistor DST. Gates of the source selection transistors SST included in different memory cell strings ST may be connected to the source selection line SSL, gates of the drain selection transistors DST included in different memory cell strings ST may be connected to the drain selection line DSL, and gates of the memory cells MC1 to MCm may be connected to a plurality of word lines WL1 to WLm, respectively. A group of memory cells connected to the same word line among memory cells included in different memory cell strings ST may be referred to as a physical page PG. Accordingly, as many physical pages PG as the word lines WL1 to WLm may be included in the memory block BLKi.

In FIG. 2, the source line CSL, the source selection line SSL, the word lines WL1 to WLm, and the drain selection line DSL may correspond to the row lines RL of FIG. 1. That is, the source line CSL, the source selection line SSL, the word lines WL1 to WLm, and the drain selection line DSL may be controlled by the row control circuit 121 of FIG. 1.

When one memory cell is a single level cell that stores one bit of data, one physical page PG may store data of one logical page. In addition, when one memory cell is a multi-level cell that stores more than two or more bits of data, one physical page PG may store data of more than two logical pages.

Hereinafter, an embodiment will be described for a triple-level cell (TLC) for convenience, but the present embodiment is not limited thereto.

Figure 3:
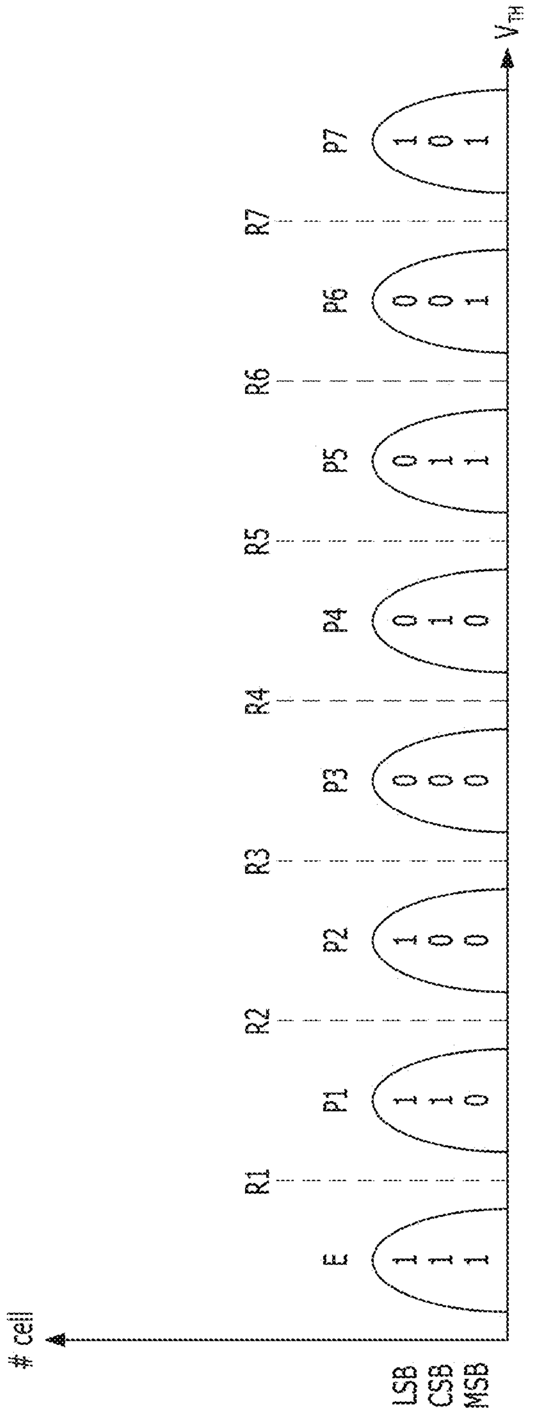
FIG. 3 is a graph for describing a threshold voltage distribution for a read operation of the triple-level cell (TLC) in accordance with an embodiment of the present invention.

FIG. 3 is a graph for describing a threshold voltage distribution for a read operation of the triple-level cell (TLC) in accordance with an embodiment of the present invention. The read operation may be an operation of reading data from memory cells commonly connected to a selected word line.

Referring to FIG. 3, the graph shows a threshold voltage distribution of program states and an erase state of a TLC memory cell. The TLC memory cell may have a threshold voltage in one state among an erase state E and first to seventh program states P1 to P7 depending on a value of programmed data. The TLC memory cell may store data of three bits configured by a most significant bit (MSB), a central significant bit (CSB) and a least significant bit (LSB). When a memory cell in which data of three bits including the MSB, the CSB and the LSB all having a value of '1,' that is, data having a value of '111,' is programmed has a threshold voltage in the erase state E. In the same manner, memory cells in which data having values of '011,' '001,' '000,' '010,' '110,' '100' and '101' are respectively programmed have threshold voltages which are included in the first to seventh program states P1 to P7, respectively.

In a TLC memory cell, one page may be physically 'one,' but may conceptually include first to third logical pages corresponding to the LSBs, the CSBs and the MSBs, respectively. The first to third logical pages may store LSB data, CSB data and MSB data, respectively. The memory device may identify memory cells whose LSBs have a value of '1' and memory cells whose LSBs have a value of '0,' by applying LSB read voltages (i.e., a third read voltage R3 and a seventh read voltage R7) corresponding to the first logical page. The memory device may identify memory cells whose CSBs have a value of '1' and memory cells whose CSBs have a value of '0,' by applying CSB read voltages (i.e., a second read voltage R2, a fourth read voltage R4, and a sixth read voltage R6) corresponding to the second logical page. The memory device may identify memory cells whose MSBs have a value of '1' and memory cells whose MSBs have a value of '0,' by applying MSB read voltages (i.e., a first read voltage R1 and a fifth read voltage R5) corresponding to the third logical page. In the threshold voltage distributions of the TLC memory cell illustrated in FIG. 3, the erase state E and the first to seventh program states P1 to P7 may be determined using the first to seventh read voltages R1 to R7.

As described in FIG. 3, the read voltages having different levels may be applied to a selected word line in order to determine the program states of the memory cells during the read operation of the TLC memory cell. The TLC memory cell may store more data than the MLC memory cell, but since it needs to form more threshold voltage distributions, the program time and the resulting read time may take longer.

Hereinafter, in an embodiment of the present invention, when a memory cell stores data of two bits or more, a method of improving performance or reducing internal current consumption (ICC) by adjusting voltage levels of bit lines at a time when a read voltage applied to a selected word line is changed will be described.

Figure 4:
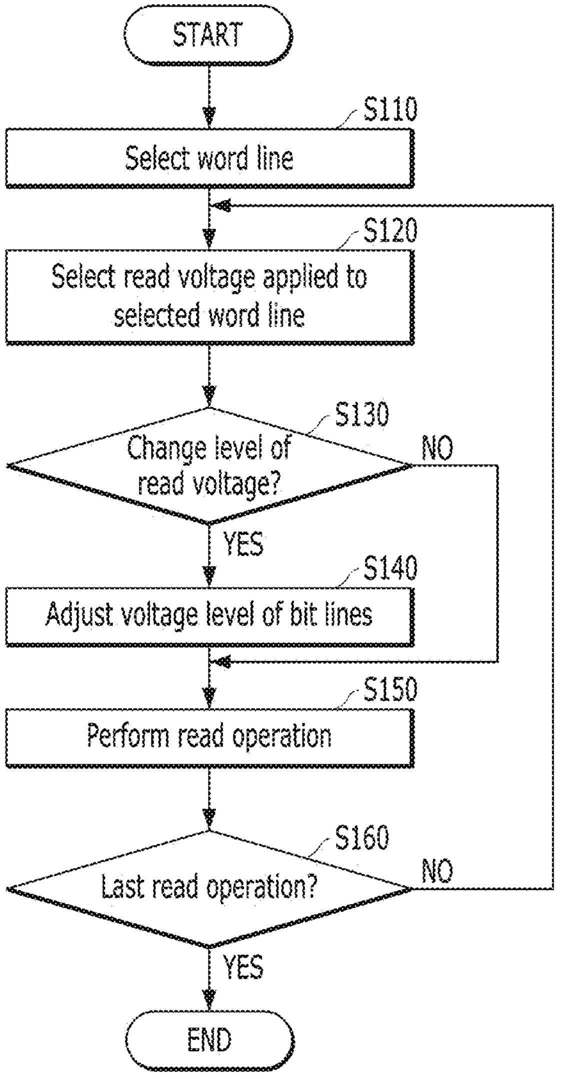
FIGS. 4 and 5 are flowcharts for describing a read operation in accordance with an embodiment of the present invention.
Figure 5:
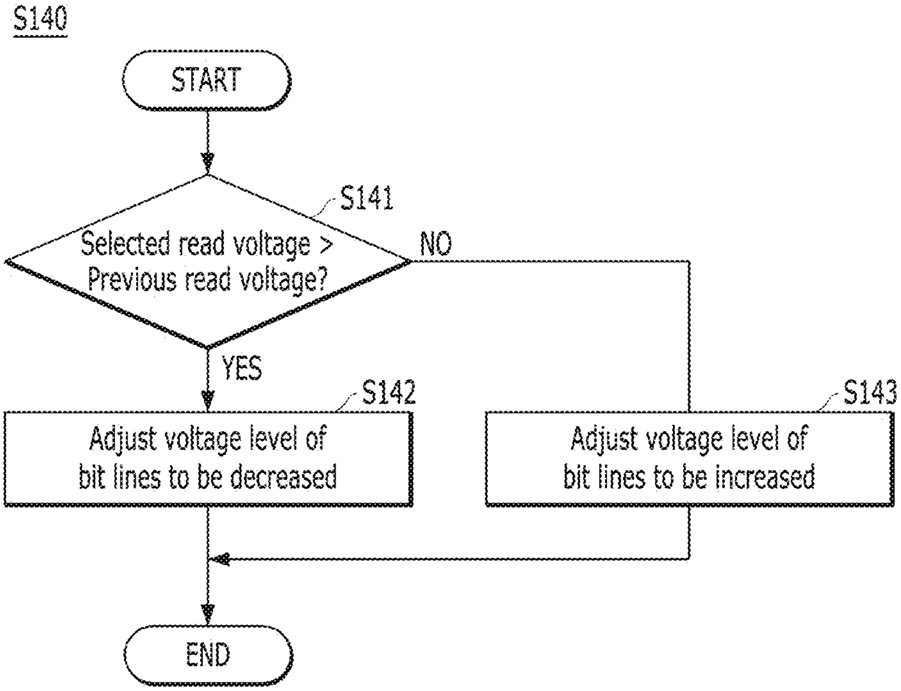

FIG. 4 is a flowchart for schematically describing a read operation in accordance with an embodiment of the present invention. FIG. 5 is a flowchart for describing an operation S140 for adjusting a voltage of bit lines in FIG. 4 in detail in accordance with an embodiment of the present invention.

Referring to FIG. 4, the row control circuit 121 of the peripheral circuit 120 may decode the row address RADD to select a word line on which a read operation is to be performed (at operation S110). For example, in order to select a first word line WL1 in a memory block and determine the erase state E and the first to seventh program states P1 to P7 of memory cells connected to the selected word line WL1, first and second read operations of applying LSB read voltages (i.e., the third read voltage R3 and the seventh read voltage R7) corresponding to the first logical page may be performed, respectively.

The voltage generation circuit 122 may generate a plurality of read voltages and a read pass voltage in response to the operation signal OPSIG. The row control circuit 121 may select a read voltage to be applied to the selected word line from among the read voltages according to the row control signal RCTRL (at operation S120). For example, for the first read operation, the row control circuit 121 may first select the third read voltage R3 from among the LSB read voltages described in FIG. 3 as a read voltage to be applied to the selected word line.

The read control circuit 132 of the control logic 130 may determine whether the selected third read voltage R3 has the same level as a read voltage applied during a previous read operation (at operation S130). When it is determined that the level of the read voltage has not changed because the previous read operation has not been performed ("NO" in operation S130), the read control circuit 132 may perform the first read operation by providing the page buffer control signals PBSIGNALS to the page buffer circuit 123 (at operation S150). The row control circuit 121 may perform the first read operation by applying the third read voltage R3 to the selected word line and the read pass voltage higher than the third read voltage R3 to unselected word lines.

Next ("NO" of operation S160), the row control circuit 121 may select the seventh read voltage R7 among the LSB read voltages described in FIG. 3 as a read voltage to be applied to the selected word line for the second read operation (at operation S120).

The read control circuit 132 may determine whether the seventh read voltage R7 selected during the second read operation has the same level as the third read voltage R3 selected during the previous first read operation (at operation S130). When it is determined that the level of the read voltage is changed ("YES" of operation S130), the read control circuit 132 may provide the page buffer control signals PBSIGNALS to the page buffer circuit 123 to adjust a voltage level of the bit lines BL1 to BLn (at operation S140).

At this time, referring to FIG. 5, since the level of the seventh read voltage R7 during the second read operation is greater than the level of the third read voltage R3 during the first read operation ("YES" of operation S141), the read control circuit 132 may provide the page buffer control signals PBSIGNALS to adjust the voltage level of the bit lines BL1 to BLn to be decreased. Accordingly, the amount of current flowing through the bit lines BL1 to BLn may be reduced, thereby reducing the cell current and the internal current consumption thereof. The row control circuit 121 may perform the second read operation by applying the seventh read voltage R7 to the selected word line and the read pass voltage higher than the seventh read voltage R7 to the unselected word lines (at operation S150) to thereby terminate the LSB read operation ("YES" in operation S160).

According to an embodiment, the row control circuit 121 may first select the seventh read voltage R7 as a read voltage to be applied to the selected word line for the first read operation (at operation S120).

The read control circuit 132 may determine whether the seventh read voltage R7 selected during the first read operation has the same level as a read voltage applied during a previous read operation (at operation S130). When it is determined that the level of the read voltage has not changed because the previous read operation has not been performed ("NO" in operation S130), the read control circuit 132 may perform the first read operation by providing the page buffer control signals PBSIGNALS to the page buffer circuit 123 (at operation S150). The row control circuit 121 may perform the first read operation by applying the seventh read voltage R7 to the selected word line and the read pass voltage higher than the seventh read voltage R7 to unselected word lines.

Next ("NO" of operation S160), the row control circuit 121 may select the third read voltage R3 among the LSB read voltages described in FIG. 3 as a read voltage to be applied to the selected word line for the second read operation (at operation S120).

The read control circuit 132 may determine whether the third read voltage R3 selected during the second read operation has the same level as the seventh read voltage R7 selected during the previous first read operation (at operation S130). When it is determined that the level of the read voltage is changed ("YES" of operation S130), the read control circuit 132 may provide the page buffer control signals PBSIGNALS to the page buffer circuit 123 to adjust a voltage level of the bit lines BL1 to BLn (at operation S140).

At this time, referring to FIG. 5, since the level of the third read voltage R3 during the second read operation is lower than the level of the seventh read voltage R7 during the first read operation ("NO" of operation S141), the read control circuit 132 may provide the page buffer control signals PBSIGNALS to adjust the voltage level of the bit lines BL1 to BLn to be increased. Accordingly, the amount of current flowing through the bit lines BL1 to BLn may be increased, thereby reducing a bit line precharge time, and improving performance. The row control circuit 121 may perform the second read operation by applying the third read voltage R3 to the selected word line and the read pass voltage higher than the third read voltage R3 to the unselected word lines (at operation S150) to thereby terminate the LSB read operation ("YES" in operation S160).

As described above, the memory device in accordance with the proposed embodiment may reduce the cell current and the internal current consumption (ICC) by decreasing the voltage level of the bit lines at a time when the level of the read voltage applied to the selected word line during the read operation is higher than the level of the previous read voltage. Alternatively, the memory device may improve the performance by reducing the bit line precharge time by increasing the voltage level of the bit lines at a time when the level of the read voltage applied to the selected word line during the read operation is reduced from the level of the previous read voltage.

Hereinafter, with reference to specific embodiments, it will be described in detail that voltage level of the bit lines BL1 to BLn are adjusted according to the page buffer control signals PBSIGNALS provided to the page buffer circuit 123.

Figure 6:
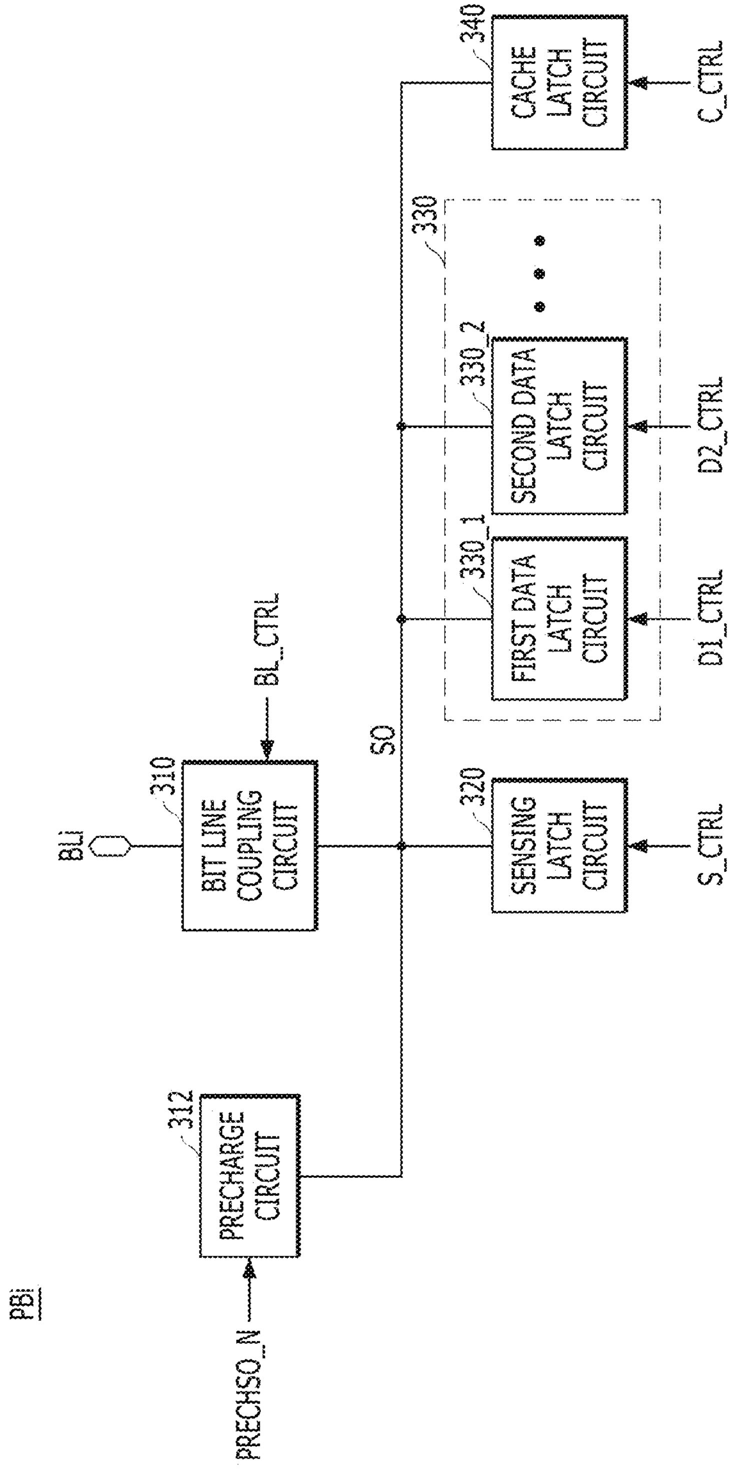
FIGS. 6 and 7 are diagrams illustrating a detailed structure of a representative page buffer of the page buffers of FIG. 1 in accordance with an embodiment of the present invention.

FIG. 6 is a diagram illustrating a detailed structure of a representative page buffer PBi of the page buffers PB1 to PBn of FIG. 1 in accordance with an embodiment of the present invention.

Referring to FIG. 6, the page buffer PBi may include a bit line coupling circuit 310, a precharge circuit 312, a sensing latch circuit 320, a plurality of data latch circuits 330, and a cache latch circuit 340. The page buffer PBi may be controlled based on the page buffer control signals PBSIGNALS generated in the control logic 130 of FIG. 1. That is, signals (e.g., BL_CTRL, PRECHSO_N, S_CTRL, D1_CTRL, D2_CTRL, . . . , C_CTRL) for controlling the page buffer PBi may be included in the page buffer control signals PBSIGNALS.

The bit line coupling circuit 310 may be selectively coupled to a corresponding bit line BLi according to a coupling control signal BL_CTRL, transfer input data transmitted from a sensing node SO to the bit line BLi during a program operation, and sense data transmitted through the bit line BLi during a read operation.

The precharge circuit 312 may precharge the sensing node SO to a core voltage level based on a precharge signal PRECHSO_N.

The sensing latch circuit 320 may store sensing data by sensing a change in a voltage level at the sensing node SO according to a sensing latch control signal S_CTRL. The sensing data has a preset logic level as an initial value, and a logic level may be maintained or reversed according to the data transmitted through the bit line BLi during a read operation or a program verification operation. The sensing latch circuit 320 may dump the sensing data to the cache latch circuit 340 during a read operation according to the sensing latch control signal S_CTRL. During the read operation or the program verification operation, the sensing latch circuit 320 may provide the voltage of the stored sensing data to the sensing circuit (126 in FIG. 1) as the sensing voltage (VPB in FIG. 1).

The cache latch circuit 340 may output the dumped data to the outside through the data input/output circuit (125 in FIG. 1) according to a cache latch control signal C_CTRL. According to an embodiment, the cache latch circuit 340 may transmit data input through the data input/output circuit 125 to the plurality of data latch circuits 330.

The plurality of data latch circuits 330 may store the input data and transfer the stored data to the sensing node SO during the program operation according to a plurality of data control signals D1_CTRL, D2_CTRL, . . . . The number of data latch circuits 330 may be designed differently according to the number of data distributions stored in the memory cell, and may be provided in a number corresponding to a single level cell, a multi-level cell, or a triple-level cell. For example, if data corresponding to a triple-level cell is input, first to third data latch circuits are provided, the first data latch circuit may receive data corresponding to a Most Significant Bit (MSB), the second data latch circuit may receive data corresponding to a Central Significant Bit (CSB), and the third data latch circuit may receive data corresponding to a Least Significant Bit (LSB).

Moreover, the page buffer PBI may include one or more verification latch circuits in addition to the above configuration, but a description of the remaining configuration will be omitted so as to describe the gist of the invention.

Figure 7:
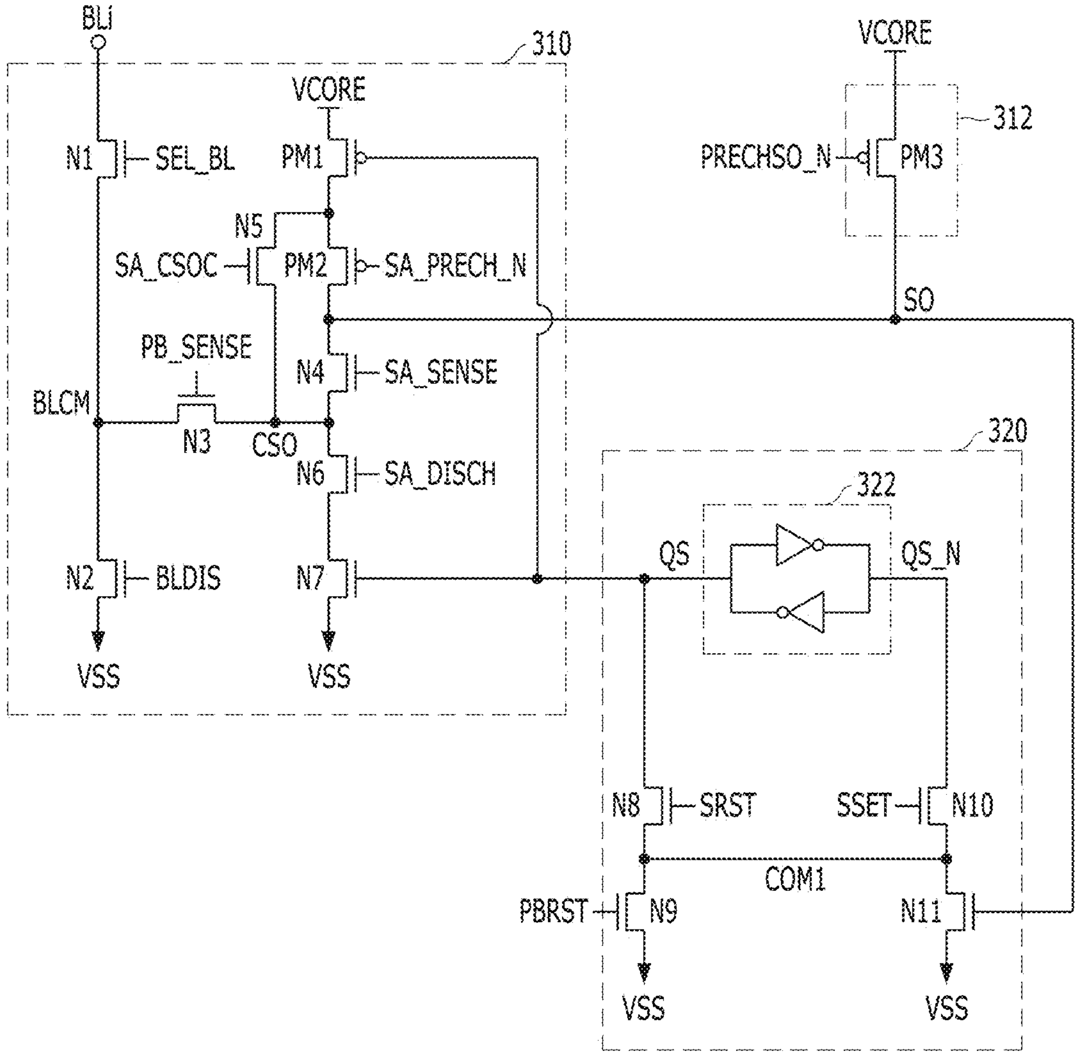

FIG. 7 is a circuit diagram illustrating a partial configuration of the page buffer PBI of FIG. 6 in more detail in accordance with an embodiment of the present invention.

Referring to FIG. 7 a detailed configuration of the bit line coupling circuit 310, the precharge circuit 312, and the sensing latch circuit 320 is shown.

The bit line coupling circuit 310 may include first to seventh NMOS transistors N1 to N7 and first and second PMOS transistors PM1 and PM2. The first NMOS transistor N1 and the second NMOS transistor N2 are connected in series between the bit line BLi and a ground voltage (VSS) terminal, and receive a bit line selection signal SEL_BL and a bit line discharge signal BLDIS as a gate, respectively. The third NMOS transistor N3 is connected between a common node BLCM of the first NMOS transistor N1 and the second NMOS transistor N2, and a current sensing node CSO, to receive a bit line sensing signal PB_SENSE through a gate. The first and second PMOS transistors PM1 and PM2 and the fourth NMOS transistor N4 are connected in series between a core voltage (VCORE) terminal and the current sensing node CSO, to receive a signal at a positive sensing node QS, a precharge control signal SA_PRECH_N, and a sensing control signal SA_SENSE, respectively. The fifth NMOS transistor N5 is connected between a common node of the first and second PMOS transistors PM1 and PM2 and the current sensing node CSO to receive a sense amplifier coupling signal SA_CSOC through a gate. The sixth and seventh NMOS transistors N6 and N7 are connected between the current sensing node CSO and the ground voltage (VSS) terminal, to receive the sense amplifier discharge signal SA_DISCH and the signal at the positive sensing node QS, respectively.

With the above configuration, the bit line coupling circuit 310 may transmit the input data transmitted from the sensing node SO to the bit line BLi, or transmit the data from the bit line BLi to the sensing node SO, based on the bit line selection signal SEL_BL, the bit line sensing signal PB_SENSE, and the sensing control signal SA_SENSE. In addition, the bit line coupling circuit 310 may discharge the bit line BLi to the ground voltage level according to the bit line selection signal SEL_BL and the bit line discharge signal BLDIS. For reference, the bit line selection signal SEL_BL, the bit line discharge signal BLDIS, the bit line sensing signal PB_SENSE, the sense amplifier coupling signal SA_CSOC, the precharge control signal SA_PRECH_N, the sensing control signal SA_SENSE, and the sense amplifier discharge signal SA_DISCH may correspond to the coupling control signal BL_CTRL of FIG. 6.

The precharge circuit 312 may include a third PMOS transistor PM3. The third PMOS transistor PM3 is connected between the core voltage (VCORE) terminal and the sensing node SO, to receive the precharge signal PRECHSO_N through a gate. The precharge circuit 312 may precharge the sensing node SO to the core voltage level based on the precharge signal PRECHSO_N.

The sensing latch circuit 320 may store sensing data for a sensing operation on the data transmitted through the bit line BLi based on a sensing reset signal SRST and a sensing set signal SSET. The sensing latch circuit 320 may include a sensing latch 322 and eighth to eleventh NMOS transistors N8 to N11. The sensing latch 322 may be configured with two inverters cross-coupled and connected between the positive sensing node QS and a negative sensing node QS_N. The eighth NMOS transistor N8 and the ninth NMOS transistor N9 are connected in series between the positive sensing node QS and the ground voltage (VSS) terminal, to receive the sensing reset signal SRST and a page reset signal PBRST as a gate, respectively. The tenth NMOS transistor N10 is connected between the negative sensing node QS_N and a first common node COM1 of the eighth NMOS transistor N8 and the ninth NMOS transistor N9, to receive the sensing set signal SSET through a gate. The eleventh NMOS transistor N11 is connected between the first common node COM1 and the ground voltage (VSS) terminal, to receive the signal at the sensing node SO as a gate to form a current path connected to the ground voltage (VSS) terminal based on the voltage level at the sensing node SO.

With the above configuration, the sensing latch circuit 320 may store the sensing data based on the sensing reset signal SRST and the sensing set signal SSET during the read operation or the program verification operation. For reference, the sensing reset signal SRST, the sensing set signal SSET, and the page reset signal PBRST may correspond to the sensing latch control signal S_CTRL of FIG. 6.

According to an embodiment of the present invention, in the page buffer PBi having the structure described in FIGS. 6 and 7, for adjusting the voltage level of the bit lines BL1 to BLn, a voltage level of the sensing control signal PB_SENSE controlling a switch (i.e., the third NMOS transistor N3) for connecting the page buffers and the bit lines respectively may be adjusted. Hereinafter, it will be described in detail that the amount of current flowing through the bit lines BL1 to BLn is adjusted using the sensing control signal PB_SENSE according to an embodiment of the present invention.

Before describing a plurality of read operations according to an embodiment of the present invention, a plurality of operations of one read operation will be described first.

Figure 8:
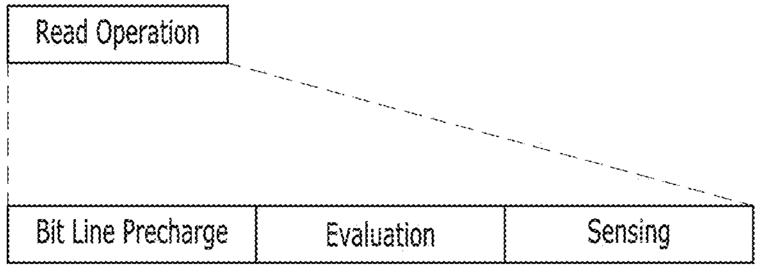
FIG. 8 is a diagram for describing a read operation in accordance with an embodiment of the present invention.

FIG. 8 is a diagram for describing a plurality of operations of a read operation.

Referring to FIG. 8, the read operation may refer to an operation of sensing a result indicating whether a threshold voltage of each of the memory cells selected as a read target is greater or less than a read voltage and storing the result in the sensing latch circuit 320 in the page buffer PBi. In order to read the data of a single-level cell (SLC), the read operation of FIG. 8 may be performed once. On the other hand, in order to read the data of a multi-level cell (MLC), the read operation of FIG. 8 may be performed three times. In addition, in order to read the data of a triple-level cell (TLC), the read operation of FIG. 8 may be performed seven times.

The read operation may include a bit line precharge operation, an evaluation operation, and a sensing operation.

The bit line precharge operation may include increasing a voltage of a bit line connected to the memory cells selected as the read target to a precharge voltage. The evaluation operation may include evaluating the threshold voltage of each of the selected memory cells. For example, among the selected memory cells, memory cells having a threshold voltage higher than a read voltage, i.e., a bit line connected to an off-cell, may maintain the precharge voltage in the evaluation operation. For memory cells having a threshold voltage lower than the read voltage, i.e., a bit line connected to an on-cell, the voltage may decrease during the evaluation operation. Therefore, a voltage of a corresponding bit line may be distinguished according to the threshold voltage of each memory cell. The sensing operation may include storing data (e.g., information) indicating whether each of the selected memory cells is an on-cell or an off-cell in the sensing latch circuit 320. This operation may be performed, for example, based on the voltage of the bit line distinguished as described above.

Figure 9A:
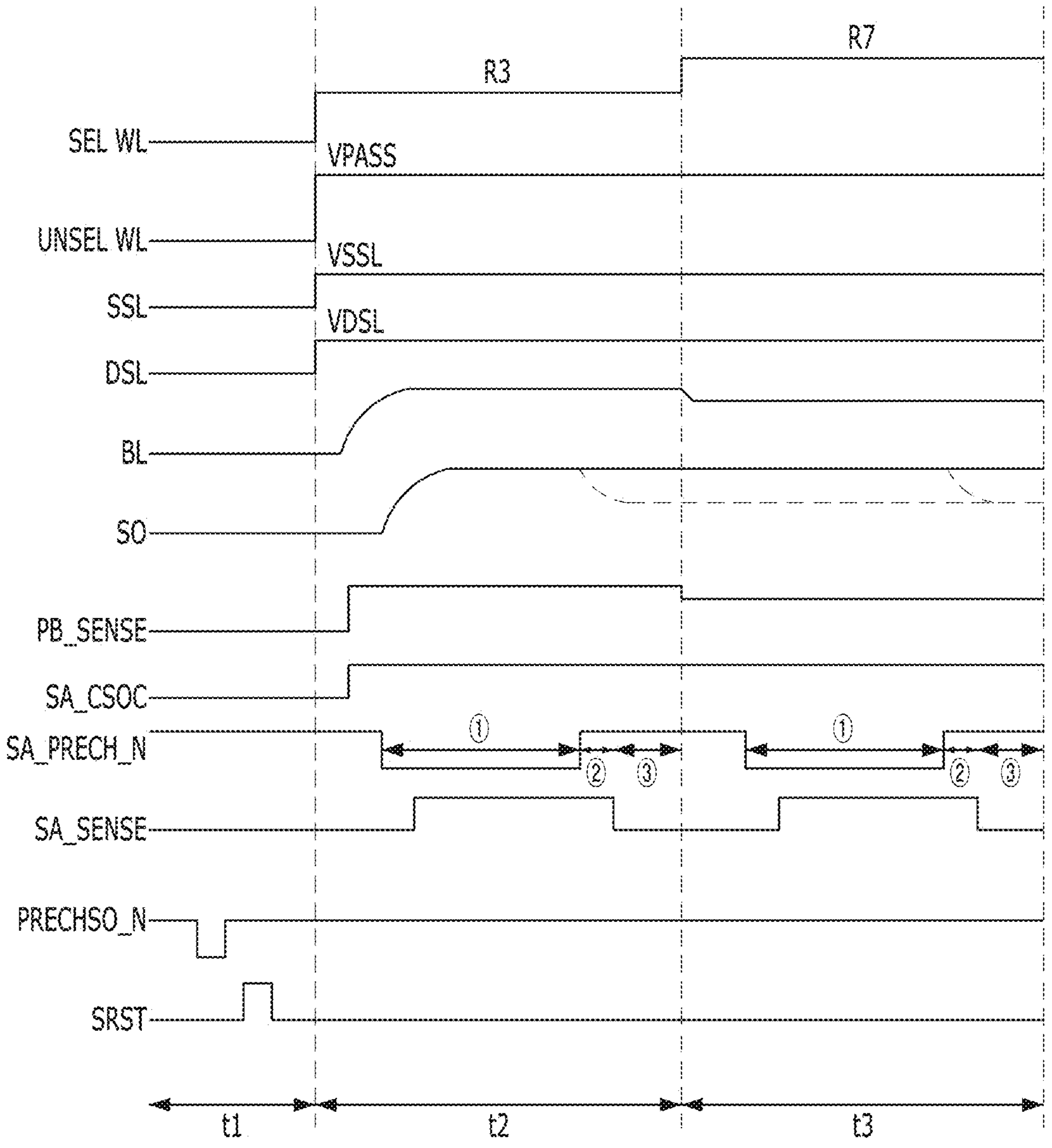
FIGS. 9A and 9B are timing diagrams for describing a read operation in accordance with an embodiment of the present invention.
Figure 9B:
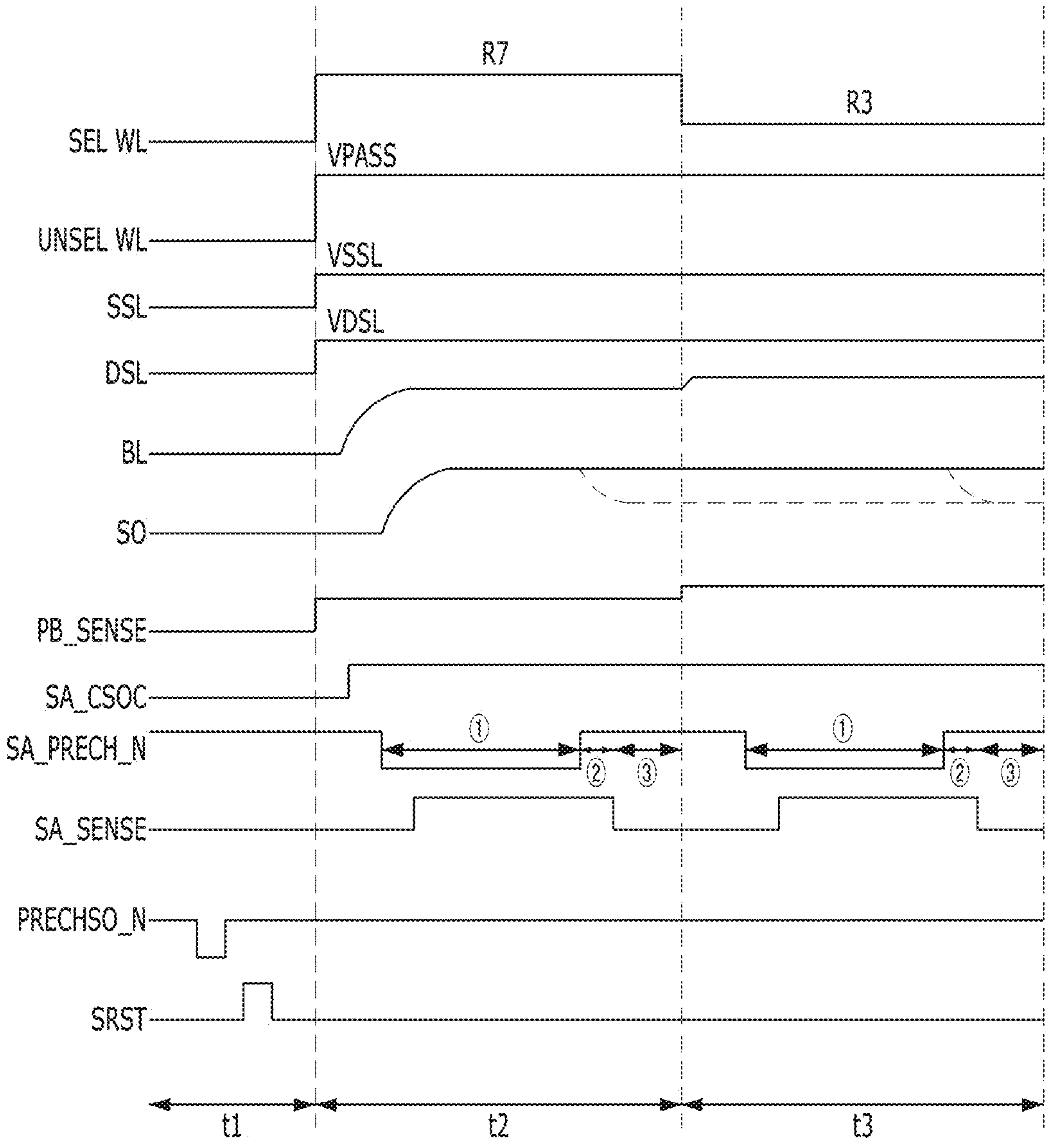

FIGS. 9A and 9B are timing diagrams for describing a read operation in accordance with an embodiment of the present invention.

Referring to FIG. 9A, in a section t1, the page buffer PBi performs an initialization operation. For example, in response to the precharge signal PRECHSO_N, the third PMOS transistor PM3 of the precharge circuit 312 is turned on to apply the core voltage VCORE to the sensing node SO. Accordingly, the eleventh NMOS transistor N11 of the sensing latch circuit 320 is turned on to apply the ground voltage VSS to the first common node COM1. Thereafter, the sensing reset signal SRST is applied, and the positive sensing node QS of the sensing latch circuit 320 is initialized to a logic low level. In this case, the bit line selection signal SEL_BL is activated to a logic high level.

In a section t2, the page buffer PBi performs a first read operation. For example, the third read voltage R3 may be applied to the selected word line SEL WL, and the pass voltage VPASS may be applied to the unselected word line UNSEL WL. The pass voltage VPASS has a voltage greater than the third read voltage R3 and is a voltage capable of turning on all corresponding memory cells regardless of threshold voltages of each of the memory cells included in the selected memory block. Accordingly, all memory cells connected to the unselected word line UNSEL WL may be maintained in a turn-on state from the section t2. Likewise, turn-on voltages VSSL and VDSL may be applied to the source selection transistor SST and the drain selection transistor DST, respectively. By applying the third read voltage R3 to the selected word line SEL WL, memory cells having a threshold voltage lower than the third read voltage R3 among memory cells connected to the selected word line SEL WL may be turned on, and memory cells having a threshold voltage higher than the third read voltage R3 may be turned off.

While the first PMOS transistor PM1 is turned on in response to the logic low level of the positive sensing node QS, the third NMOS transistor N3 and the fifth NMOS transistor N5 are turned on in response to the sensing control signal PB_SENSE and the sense amplifier connection signal SA_CSOC. After the second PMOS transistor PM2 is turned on according to the precharge control signal SA_PRECH_N, the bit line BLi and the sensing node SO are electrically connected through the current sensing node CSO as the NMOS transistor N4 is turned on according to the sensing signal SA_SENSE. Accordingly, a bit line precharge operation ① in which the bit line BLi is precharged to a predetermined level is performed.

After that, the second PMOS transistor PM2 is turned off in response to the internal sensing node precharge signal SA_PRECH_N. Accordingly, an evaluation operation ② in which a voltage level of the sensing node SO is changed according to an amount of cell current flowing through the bit line BLi is performed.

Then, as the NMOS transistor N4 is turned off in response to the sensing signal SA_SENSE, a sensing operation ③ in which sensing data indicating whether the memory cell is an on-cell or an off-cell is stored in the sensing latch circuit 320 based on the voltage level of the sensing node SO is performed. According to an embodiment, the sensing data may be stored in one latch circuit of the plurality of data latch circuits 330 rather than the sensing latch circuit 320. The voltage level of the sensing node SO is maintained at a logic high level or is discharged to a logic low level according to a cell current of the bit line BLi. Thereafter, the negative sensing node QS_N maintains a logic high level or is set to a logic low level according to the voltage level of the sensing node SO. Accordingly, the first read operation may be terminated.

In a section t3, the page buffer PBi performs a second read operation. The seventh read voltage R7 having a voltage level higher than the third read voltage R3 may be applied to the selected word line SEL WL. The read control circuit 132 may lower the voltage level of the sensing control signal PB_SENSE to a predetermined level. Accordingly, the amount of current flowing through the bit lines BL1 to BLn is reduced, thereby reducing the cell current and the internal current consumption. Like the first read operation, after the bit line precharge operation ①, the evaluation operation ②, and the sensing operation ③ are sequentially performed, the negative sensing node QS_N may be set up according to the voltage level of the sensing node SO, and the second read operation may be terminated.

Referring to FIG. 9B, in a section t1, the page buffer PBi performs an initialization operation.

In a section t2, the page buffer PBi performs a first read operation. For example, the seventh read voltage R7 may be applied to the selected word line SEL WL, and the pass voltage VPASS may be applied to the unselected word line UNSEL WL. The pass voltage VPASS has a voltage greater than the seventh read voltage R7 and is a voltage capable of turning on all corresponding memory cells regardless of threshold voltages of each of the memory cells included in the selected memory block. Accordingly, all memory cells connected to the unselected word line UNSEL WL may be maintained in a turn-on state from the section t2. Likewise, turn-on voltages VSSL and VDSL may be applied to the source selection transistor SST and the drain selection transistor DST, respectively.

As descried in FIG. 9A, a bit line precharge operation ①, an evaluation operation ②, and a sensing operation ③ are sequentially performed, and the first read operation may be terminated.

In a section t3, the page buffer PBi performs a second read operation. The third read voltage R3 having a voltage level higher than the seventh read voltage R7 may be applied to the selected word line SEL WL. The read control circuit 132 may increase the voltage level of the sensing control signal PB_SENSE to a predetermined level. Accordingly, the amount of current flowing through the bit lines BL1 to BLn may be increased, thereby reducing a bit line precharge time, and improving performance.

After that, the bit line precharge operation ①, the evaluation operation ②, and the sensing operation ③ are sequentially performed, and the second read operation may be terminated.

In FIGS. 3 to 9B, the embodiments of the present invention applied to a read operation of a memory device have been described. However, the present invention is not limited thereto, and may also be applied to a program verification operation of a program loop. The program operation may include at least one program loop. Each program loop may include a program voltage application operation for applying a program voltage and a program verification operation for verifying a program result using a verification voltage. This program verification operation is very similar to the read operation.

Hereinafter, an embodiment of the present invention applied in a program verification operation will be described with reference to FIGS. 10 to 12.

Figure 10:
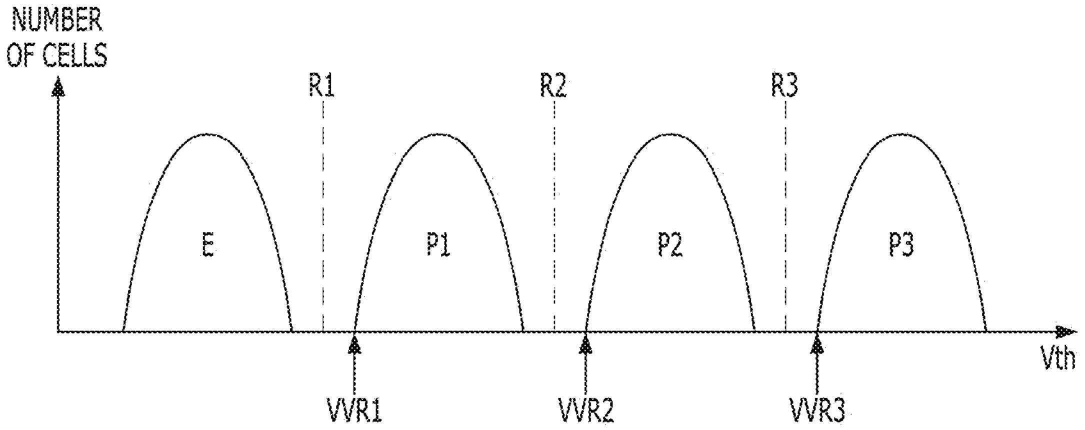
FIG. 10 is a graph for describing a threshold voltage distribution for a program verification operation of a multi-level cell (MLC) in accordance with an embodiment of the present invention.

FIG. 10 is a graph for describing a threshold voltage distribution for a program verification operation of a multi-level cell (MLC) in accordance with an embodiment of the present invention.

Referring to FIG. 10, the graph shows a threshold voltage distribution of program states and an erase state of an MLC memory cell. The MLC memory cell may have a threshold voltage in one state among an erase state E and first to third program states P1 to P3 depending on a value of programmed data. Therefore, a first read voltage R1, a second read voltage R2, and a third read voltage R3 may be used to read the data stored in the MLC memory cell.

For the program verification operation, a first verification voltage VVR1 corresponding to the first program state P1, a second verification voltage VVR2 corresponding to the second program state P2, and a third verification voltage VVR3 corresponding to the third program state P3 may be used.

Figure 11:
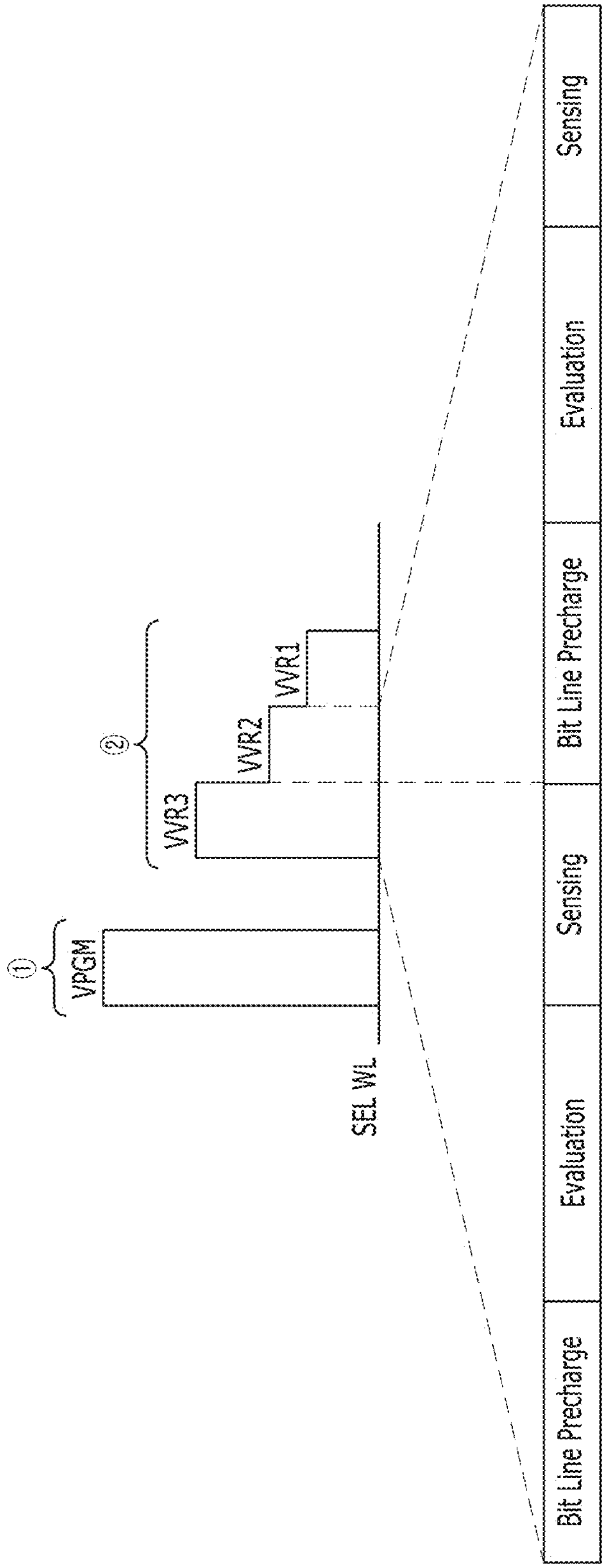
FIG. 11 is a diagram for describing a program verification operation of a program loop in accordance with an embodiment of the present invention.

FIG. 11 is a diagram for describing a program verification operation of a program loop in accordance with an embodiment of the present invention.

Referring to FIG. 11, during a program voltage application operation T, a program voltage VPGM is applied to a selected word line SEL WL. Although not shown in FIG. 11, a program pass voltage may be applied to unselected word lines during the program voltage application operation ①. During the program voltage application operation ①, threshold voltages of memory cells in a program allowance state, among memory cells connected to the selected word line SEL WL, may increase. The memory cells in the program allowance state may refer to memory cells connected to a bit line to which a program allowance voltage is applied, among the memory cells connected to the selected word line SEL WL. During the program voltage application operation ①, threshold voltages of memory cells in a program inhibition state, among memory cells connected to the selected word line SEL WL, may not increase. The memory cells in the program inhibition state may refer to a memory cell connected to a bit line to which a program inhibition voltage is applied, among the memory cells connected to the selected word line SEL WL. The program inhibition voltage may be a voltage higher than the program allowance voltage.

In a program verification operation ② after the program voltage application operation ①, verification operations on memory cells to be programmed for each of the first to third program states P1 to P3 may be performed. As illustrated in FIG. 11, it is first determined whether the threshold voltage of each of the memory cells to be programmed to the third program state P3 is greater than the third verification voltage VVR3. To this end, the third verification voltage VVR3 may be applied to the selected word line SEL WL. Thereafter, it is determined whether the threshold voltage of each of the memory cells to be programmed to the second program state P2 is greater than the second verification voltage VVR2. To this end, the second verification voltage VVR2 is applied to the selected word line SEL WL. Thereafter, it is determined whether the threshold voltage of each of the memory cells to be programmed to the first program state P1 is greater than the first verification voltage VVR1. To this end, the first verification voltage VVR1 is applied to the selected word line SEL WL.

In FIG. 11, during the program verification operation ②, the third program state P3, the second program state P2, and the first program state P1 are verified in that order, but this invention is not limited thereto. For example, the first program state P1 may be verified, the second program state P2 may be verified, and finally the third program state P3 may be verified. In addition, in FIG. 11, a case where the verification operations during the program verification operation ② are performed on all of the first to third program states P1 to P3 is described, but this invention is not limited thereto. For example, in the program verification operation ②, the verification operations may be performed only on one or two program states among the first to third program states P1 to P3.

Referring to FIG. 11, each verification operation of the program verification operation ② may include a bit line precharge operation, an evaluation operation, and a sensing operation, as described in FIG. 8. The verification operation may be substantially the same as the read operation, except that a verification result does not output to the outside but stores in the latch circuit in the page buffer PBi.

Figure 12:
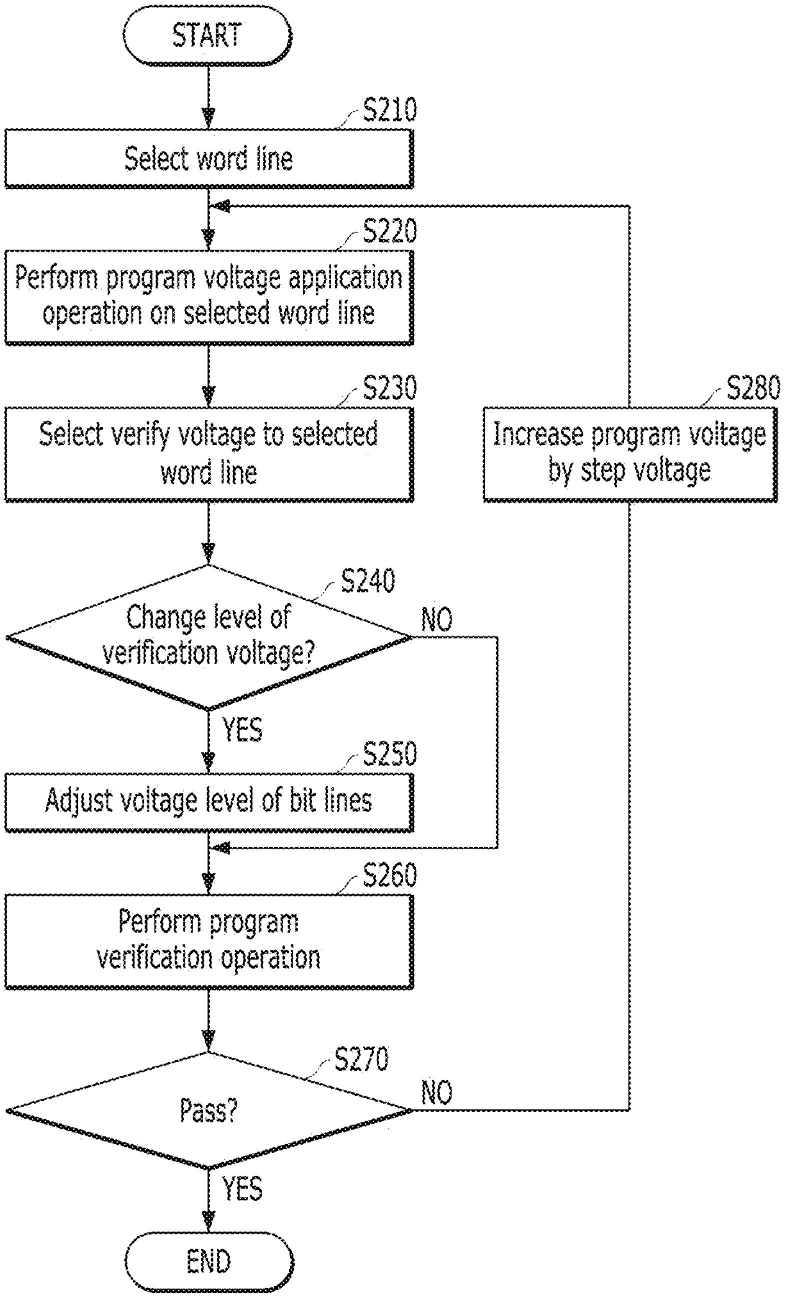
FIG. 12 is a flowchart for describing a program verification operation in accordance with an embodiment of the present invention.

FIG. 12 is a flowchart for describing a program verification operation in accordance with an embodiment of the present invention.

Referring to FIG. 12, the row control circuit 121 of the peripheral circuit 120 may decode the row address RADD to select a word line on which a program operation is to be performed (at operation S210). For example, a first word line WL1 in a memory block may be selected.

The peripheral circuit 120 may perform a program loop for memory cells connected to the selected word line under the control of the control logic 130.

First, the page buffer circuit 123 may apply a program allowance voltage to a bit line of memory cells selected as a program target, and a program inhibition voltage to a bit line of memory cells selected as a non-program target, in response to the page buffer control signals PBSIGNALS. The voltage generation circuit 122 may generate a plurality of program voltages and a program pass voltage in response to the operation signal OPSIG. The row control circuit 121 may apply a program voltage to the selected word line and apply a program pass voltage to the unselected word lines. Accordingly, a program voltage application operation of memory cells connected to the selected word line may be performed (at operation S220).

In order to perform a program verification operation, the row control circuit 121 may select a verification voltage (e.g., the first verification voltage VVR1) to be applied to the selected word line among a plurality of verification voltages according to the row control signal RCTRL (at operation S230).

When it is determined that the level of the verification voltage has not changed because the previous verification operation has not been performed ("NO" of operation S240), the read control circuit 132 may perform the verification operation by providing the page buffer control signals PBSIGNALS to the page buffer circuit 123 (at operation S260). The row control circuit 121 may apply the first verification voltage VVR1 to the selected word line and a pass voltage higher than the first verification voltage VVR1 to the unselected word lines.

The sensing circuit 126 may output the pass or fail signal PASS/FAIL to the control logic 130 by sensing the cell current flowing through the bit line according to the sensing voltage VPB. The control logic 130 may determine whether the program operation is pass or fail according to the pass or fail signal PASS/FAIL (at operation S270). When it is determined that the program operation is successful ("YES" in operation S270), the program operation for the selected word line may be terminated.

On the other hand, when it is determined that the program operation has failed ("NO" in operation S270), the voltage generation circuit 122 may increase the program voltage by a predetermined step voltage in response to the operation signal OPSIG (at operation S280), and the row control circuit 121 may perform the program voltage application operation (at operation S220).

After that, the row control circuit 121 may select the second verification voltage VVR2 to be applied to the selected word line among the verification voltages according to the row control signal RCTRL. The read control circuit 132 may determine whether the second verification voltage VVR2 is the same as the previous first verification voltage VVR1 (at operation S240). When it is determined that the level of the verification voltage is changed ("YES" of operation S240), the read control circuit 132 may provide the page buffer control signals PBSIGNALS to the page buffer circuit 123 to adjust the voltage level of the bit lines BL1 to BLn (at operation S250).

For example, when the level of the second verification voltage VVR2 is greater than the level of the first verification voltage VVR1, the read control circuit 132 may lower the voltage level of the sensing control signal PB_SENSE to adjust the voltage level of the bit lines BL1 to BLn to be decreased. Accordingly, the amount of current flowing through the bit lines BL1 to BLn is reduced, thereby reducing the cell current and the internal current consumption. On the other hand, when the level of the second verification voltage VVR2 is less than the level of the first verification voltage VVR1, the read control circuit 132 may adjust the voltage level of the sensing control signal PB_SENSE to a predetermined level to adjust the voltage level of the bit lines BL1 to BLn to be increased. Accordingly, the amount of current flowing through the bit lines BL1 to BLn is increased to reduce the bit line precharge time, thereby improving performance.

The row control circuit 121 may perform the verification operation by applying the second verification voltage VVR2 to the selected word line and applying the pass voltage higher than the second verification voltage VVR2 to the unselected word lines (at operation S260). When it is determined that the program operation is successful ("YES" in operation S270), the program operation for the selected word line may be terminated.

When it is determined that the program operation has failed ("NO" in operation S270), the peripheral circuit 120 may increase the program voltage by a predetermined step voltage and repeat the operations S220 to S260. For reference, when the number of executions of the program loop reaches a maximum allowable number, the program operation for the selected word line may end in failure.

As described above, in accordance with an embodiment of the present invention, the memory device may reduce the cell current and the internal current consumption (ICC) by reducing the voltage level of bit lines when the level of the read voltage applied to the selected word line increases more than the level of the previous read voltage during the read operation or program verification operation.

Alternatively, the memory device may reduce the bit line precharge time and improve performance by increasing the voltage level of the bit lines when the level of the read voltage applied to the selected word line during the read operation is reduced from the level of the previous read voltage.

Various embodiments of the present invention have been described in the drawings and specification. Although specific terminologies are used here, the terminologies are only to describe the embodiments of the present invention. Therefore, the present invention is not restricted to the above-described embodiments and many variations are possible within the spirit and scope of the present invention. It should be apparent to those skilled in the art that various modifications can be made based on the technological scope of the present invention in addition to the embodiments disclosed herein. The embodiments may be combined to form additional embodiments It should be noted that although the technical spirit of this disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal. Furthermore, the embodiments may be combined to form additional embodiments.

What is claimed is:

1. A memory device comprising:

a memory cell array including a plurality of memory cells;

a peripheral circuit coupled to the memory cell array through a plurality of word lines and a plurality of bit lines, and configured to perform a plurality of program loops on selected memory cells among the memory cells, each program loop including a program voltage application operation and a program verification operation; and a control logic configured to control the peripheral circuit to adjust, during a current program verification operation, a voltage level of the bit lines when a level of a verification voltage applied to a selected word line during the current program verification operation is different from a level of a verification voltage applied during a previous program verification.

2. The memory device of claim 1, wherein the control logic is configured to decrease the voltage level of the bit lines when the level of the verification voltage applied during the current program verification operation is greater than the level of the verification voltage applied during the previous program verification operation.

3. The memory device of claim 1, wherein the control logic is configured to increase the voltage level of the bit lines to be increased when the level of the verification voltage applied during the current program verification operation is lower than the level of the verification voltage applied during the previous program verification operation.

4. An operating method of a memory device, the operating method comprising:

performing a first verification operation including:

applying a first verification voltage to a word line selected from a plurality of word lines; and sensing an amount of current flowing through a plurality of bit lines according to a sensing control signal; and performing a second verification operation including:

applying a second verification voltage to the selected word line;

adjusting a voltage level of the sensing control signal when a level of the second verification voltage is different from a level of the first verification voltage; and sensing the amount of current flowing through the bit lines according to the sensing control signal.

5. The operating method of claim 4, wherein the adjusting the voltage level of the sensing control signal includes decreasing the voltage level of the sensing control signal when the level of the second verification voltage is greater than the level of the first verification voltage.

6. The operating method of claim 4, wherein the adjusting the voltage level of the sensing control signal includes increasing the voltage level of the sensing control signal when the level of the second verification voltage is lower than the level of the first verification voltage.

* * * * *